(12) United States Patent
Gribben et al.

(10) Patent No.: US 8,159,299 B2
(45) Date of Patent: Apr. 17, 2012

(54) DUPLICATE FEEDBACK NETWORK IN CLASS D AMPLIFIERS

(75) Inventors: Anthony Gribben, Edinburgh (GB); Mykhaylo Teplechuk, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 34 days.

(21) Appl. No.: 12/799,601

(22) Filed: Apr. 28, 2010

(65) Prior Publication Data
US 2011/0248781 A1    Oct. 13, 2011

(30) Foreign Application Priority Data
Apr. 12, 2010 (EP) ..................... 10392001

(51) Int. Cl.
*H03F 3/217* (2006.01)
(52) U.S. Cl. .................... 330/251; 300/207 A
(58) Field of Classification Search ............... 330/10, 330/207 A, 251
See application file for complete search history.

(56) References Cited

U.S. PATENT DOCUMENTS

| | | | |
|---|---|---|---|
| 5,805,020 A | 9/1998 | Danz et al. | |
| 6,078,214 A * | 6/2000 | Zhang | .............. 330/10 |
| 7,394,314 B2 | 7/2008 | May | |
| 7,417,504 B2 | 8/2008 | Strydom et al. | |
| 7,432,759 B2 | 10/2008 | Cho et al. | |
| 7,528,653 B2 | 5/2009 | May | |
| 2002/0024383 A1 | 2/2002 | Botti et al. | |
| 2004/0222845 A1 | 11/2004 | Yang et al. | |
| 2007/0139109 A1 | 6/2007 | Honda et al. | |
| 2008/0284508 A1* | 11/2008 | Walker et al. | .............. 330/10 |
| 2010/0103015 A1* | 4/2010 | Yoshida et al. | ............. 341/143 |

OTHER PUBLICATIONS

European Search Report, 10392001.3-2215, Mail date—Oct. 1, 2010, Dialog Semiconductor GmbH.

* cited by examiner

*Primary Examiner* — Khanh Nguyen

(74) *Attorney, Agent, or Firm* — Saile Ackerman LLC; Stephen B. Ackerman

(57) ABSTRACT

A circuit and a method are provided for suppressing the pop and click noise during the power on and power off of Class D amplifiers. The technique also suppresses pops and clicks when the Class D amplifier enters or exits standby mode. A duplicate feedback network is used to establish the stable operating points, including offsets in the Class D circuit without turning on the outputs. The technique works by gradually propagating or dissipating the offset through the signal path of a Class D amplifier by swapping the differential outputs using switches to suppress pops and clicks when starting up and shutting down the amplifier.

26 Claims, 4 Drawing Sheets

FIG. 1 – Prior Art

DUPLICATE FEEDBACK NETWORK IN CLASS D AMPLIFIERS

BACKGROUND OF THE INVENTION

1. Field of the Invention

This invention generally relates to Class D amplifiers. More particularly, this invention relates to a circuit and a method for suppressing pop and click noise during power-on and power-off of the amplifier.

2. Description of Related Art

The major components of a basic class D amplifier are shown in FIG. 1. The raw input 1 is connected to an adder circuit 4, which subtracts from the input 1 a feedback signal 5. The basic amplifier uses feedback from the output of a half-bridge output stage 19 to help compensate for variations in the bus voltages and to correct distortion. The half-bridge output 19 is connected to a feedback path or network 2, whose output 5 is then combined with the raw input 1 at the adder 4. The adder output 6 then is connected to a filter 3, which generates a modified audio input 14. The comparator, C, 11 compares a high frequency triangular wave 15 and the modified audio input 14 and generates pulses whose width corresponds to the amplitude and frequency of the audio input signal 14. The pulse width modulated (PWM) output 18 is fed into the speaker 16. The output 17 of the comparator drives the switching controller 12. The switching controller 12 drives a high power switch 19, whose output 18 is a higher power replica of the comparator's output 17.

When audio circuits are turned on, pop and click noise can occur on the audio speaker output as quiescent voltages are established. Such effects are undesirable and measures must be taken to suppress them. In the case of Class D amplifiers, there is a feedback loop which includes the nodes which are connected directly to the audio speaker output. There is the problem of establishing the operating point of the feedback loop without causing a step on the output which would lead to unwanted audio artifacts.

The following patents represent the prior related art.

U.S. Pat. No. 7,528,653 B2—Class-D Amplifier with Noise Immunity Feedback (May) describes a class-D amplifier which includes a switching transistor section, a filter, an analog to digital converter, and a feedback module. This amplifier structure provides a method and an apparatus for dynamically minimizing and/or compensating for total harmonic distortion (THD), transient noise, and/or power supply noise of class-D amplifiers.

U.S. Pat. No. 7,432,759 B2—Elimination of Pop-Up Noise in Class D Amplifier (Cho et al.) describes a class D amplifier which includes a driver circuit and a reset circuit. The driver circuit is configured to amplify a PWM (pulse width modulation) signal to generate an amplified PWM signal. The reset circuit applies a predetermined voltage at an input of the driver circuit for a time period after a power supply voltage is applied or before the power supply voltage is deactivated, for eliminating pop-up noise.

U.S. Pat. No. 7,417,504 B2—Startup and Shutdown Click Noise Elimination for Class D Amplifier (Strydom et al.) describes a method of minimizing an audible click noise from a speaker in a Class D audio power amplifier upon shutdown or startup of a switching stage, having two switches series connected at a node, the speaker connected to the node via an output filter comprising an inductor and a capacitor, the switches being controlled by a controller.

U.S. Pat. No. 7,394,314 B2—Class-D Amplifier with Noise-Immunity Feedback (May) describes a class-D amplifier which includes a switching transistor section, a filter, an analog to digital converter, and a feedback module. This amplifier structure provides a method and an apparatus for dynamically minimizing and/or compensating for total harmonic distortion (THD), transient noise, and/or power supply noise of class-D amplifiers.

BRIEF SUMMARY OF THE INVENTION

It is the objective of this invention to provide a circuit and a method for suppressing the pop and click noise during the power on and power off of Class D amplifiers.

The objects of this invention are further achieved by a duplicate feedback resistor network in Class D amplifiers. The objects of this invention are further achieved by an input section with input switches which takes audio input and drives a first input to a control circuit, which drives output pre-drivers. These output pre-drivers drive an H-bridge switch, which drives differential audio outputs and a regular feedback network. The regular feedback network which is in communication with the differential audio outputs is connected to the input section and drives a second input of said control circuit. The duplicate feedback network which is in communication with the control circuit output is connected to the input section, through said input switches back into said control circuit. The duplicate feedback network is used to complete a control loop of said Class D amplifier in order to suppress pops and clicks noise when starting up and exiting a standby mode and shutting down or entering said standby mode in said Class D amplifier.

DETAILED DESCRIPTION OF THE INVENTION

Figure 1:
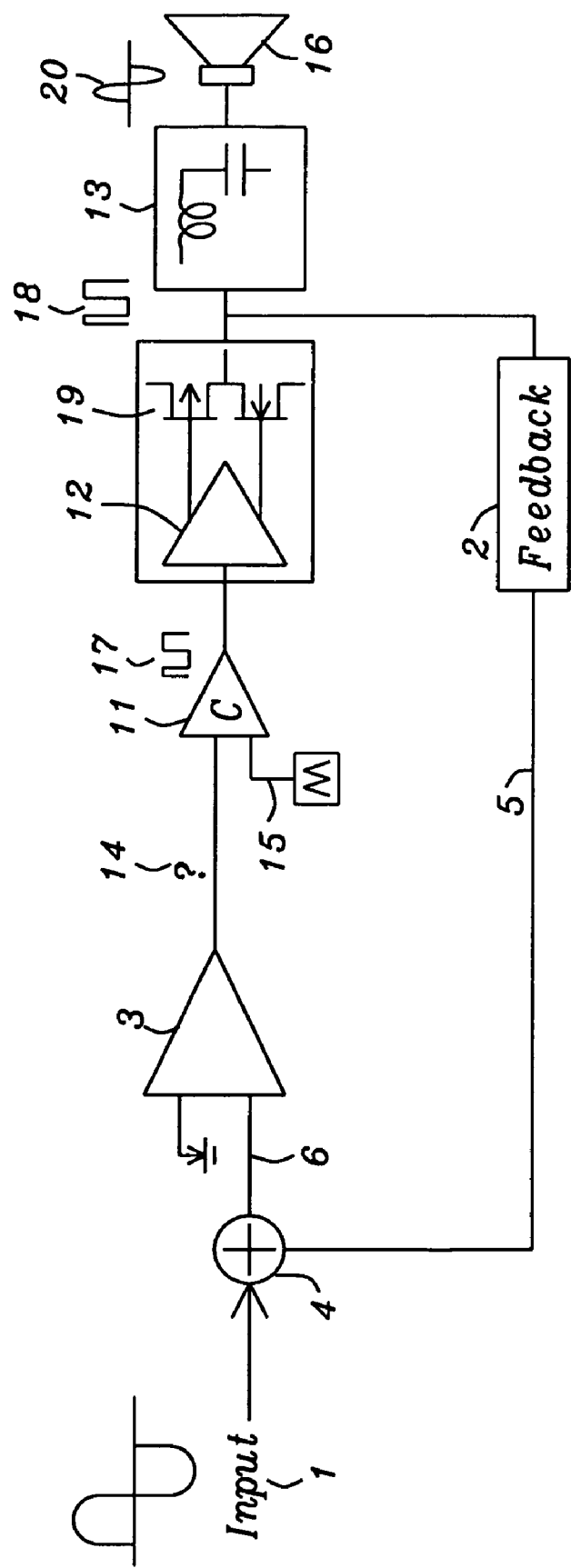
FIG. 1 shows a basic prior art Class D amplifier, which is single-ended with no H-bridge.
Figure 2:
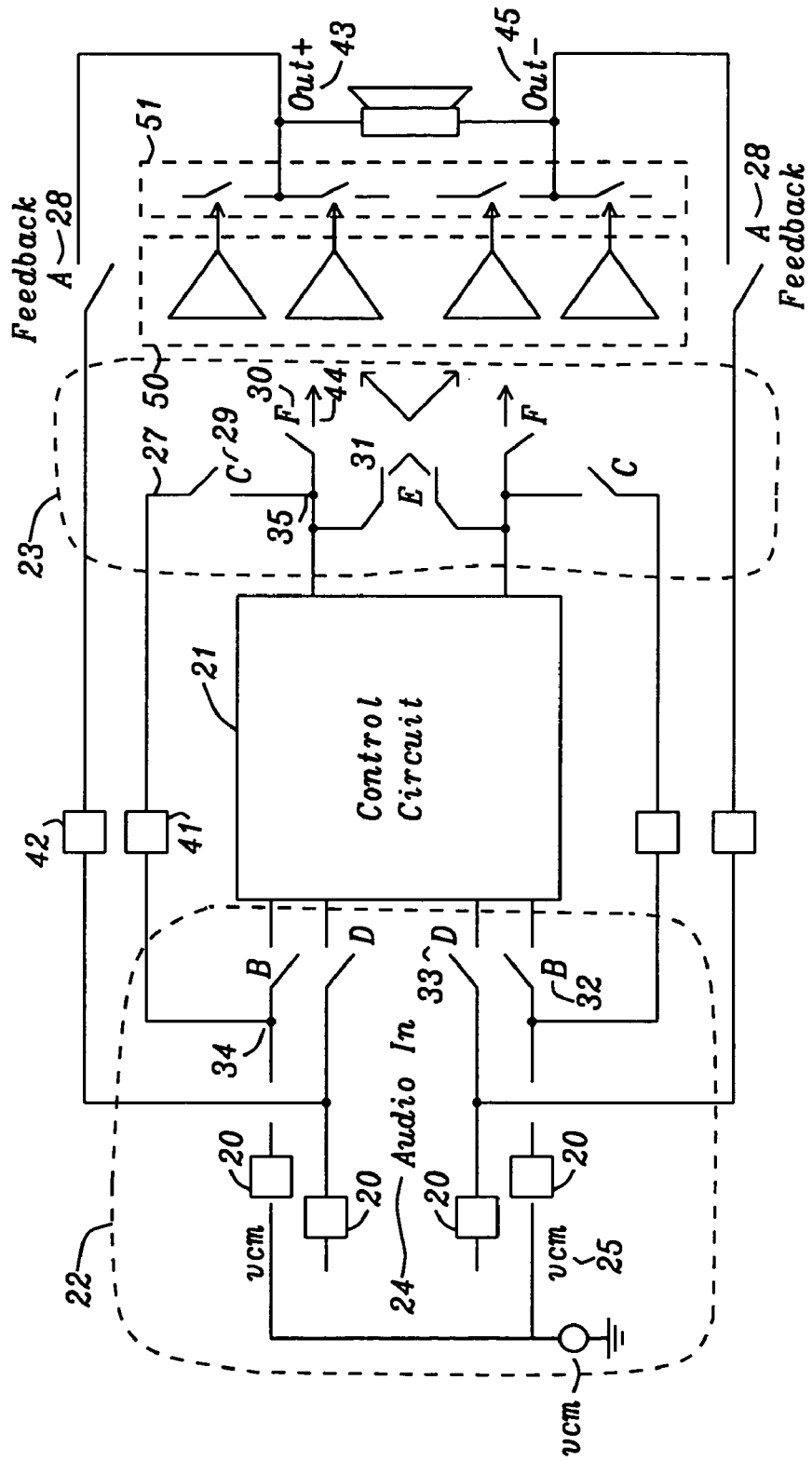
FIG. 2 shows the main embodiment of the duplicate feedback network of the invention, which is a differential design with an H-bridge.

FIG. 2 shows the main embodiment of the invention. FIG. 2 shows a Class D amplifier, which consists of a control circuit 21, an input section 22 made of resistors 20 and switches 32,33, and an output section which includes pre-drivers 50 and an H-bridge switch 51. The H-bridge switches are connected to Out+(43) and Out−(45). The audio input 24 and the H-bridge output 25 are fed into the control circuit 21. The output of the control circuit 26 is a pulse-width modulated (PWM) signal which is buffered and used to drive an H-bridge switching stage. When the loop is running, the feedback is taken from the H-bridge output 43. The issue is that any offsets in the signal path need to be propagated to the output 43 without causing any pops and clicks on the audio output 43.

In this invention, a duplicate feedback network 41, with its input connected to the common mode voltage (vcm) 34 and its output connected to the pulse-width modulated output 27 prior to the buffers 35, is included. This network is used to establish the operating voltages, including any offsets in the signal path, when powering up or exiting standby. Switches B 32 and C 29 are closed and switches A 28 and D 33 are opened (see FIG. 2). The key point is that the circuit in FIG. 2 operates differentially around a common mode bias point. The common mode voltage is fed to the inputs of the duplicate feedback network to establish the bias point. The control circuit is then powered up. After power up, the control circuit may initially be in a reset state from which it is released after the bias currents are established. The H-bridge 51 output 43 is grounded while this takes place.

The next step is to gradually introduce the offset on the H-bridge output 43. The H-bridge output 43 is enabled and then the signal is transferred from the control circuit output to the H-bridge output 43 using switches E 31 and F 30. By alternating which pulses are sent through switches E 31 and which pulses are sent through switches F 30, the output 43 rise time can be controlled thereby avoiding any audible signals on the output. The duty cycle of selecting F switches 30 over E switches 31 is gradually increased from 50% to 100%. The rate of increase in duty cycle on the F switches 30 is slow enough to be inaudible. Finally, the duplicate feedback network is deselected by opening switches C 29, and the real feedback network 42 selected by closing switches A 28. In FIG. 2, we see the regular feedback paths coming from Out+43 and Out−45 going through switch A 28.

The process to assert powerdown or standby requires muting the output by removing the audio input and then gradually reducing the offset before powering down the signal path. Firstly, the signal is removed by selecting the duplicate feedback path. This is selected by opening switches D 33 and A 28, and closing switches C 29 and B 32. The offset is then removed from the H-bridge 51 by beginning to alternate pulses between the F 30 and E 31 switches until the duty cycle is reduced from 100% to 50%. This is carried out at a rate which is slow enough to be inaudible. When the duty cycle has been at 50% for long enough for the offset to have been dissipated from the output, the H-bridge 51 is powered down. Thereafter the control circuit is powered down.

Figure 3:
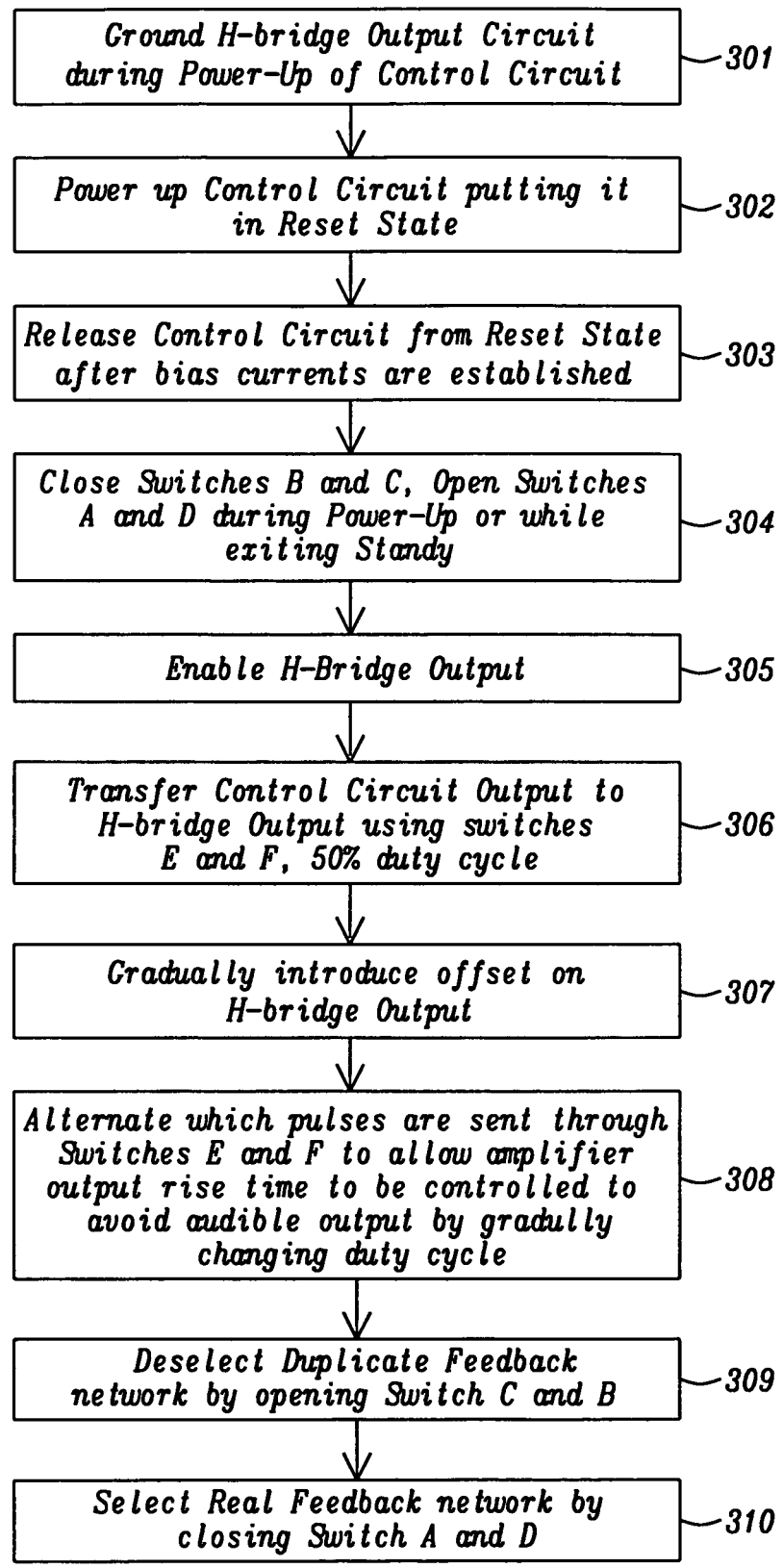
FIG. 3 shows a method flowchart for the elimination of clicking and popping noise for Class D amplifiers during Power-up or during exiting of Standby.

FIG. 3 shows the flowchart of a method for eliminating popping and clicking noise in Class D amplifiers during power-up or during exiting standby. The method assumes a duplicate feedback network which is used to establish operating voltages and offsets in a signal path during power-up and during exiting standby and a set of switches A, B, C, D, E and F which enable said duplicate feedback network. The first block 301 in the flowchart shows the grounding of an H-bridge output circuit during powering up of the control circuit. The next block 302 is the powering up of a control circuit which will then be in a reset state. Next is the 303 block which is the releasing of a control circuit from the reset state after bias currents are established. The 304 block shows the closing of switches B and C and the opening of switches A and D during power-up or while exiting standby. Next, the H-bridge needs to be enabled 305 and 306 before beginning the gradual introduction of offsets in blocks 307 and 308. The next block 305 shows the enabling of the H-bridge output. The next block 306 shows transferring control circuit output to the H-bridge output using switches E and F with a 50% duty cycle. The next block 307 and 308 shows the alternating of pulses which are sent through switches E and F so that the Class D amplifier output rise time can be controlled so as to avoid audible signals on the amplifier output by gradually changing the duty cycle. The 309 block shows the deselecting of the duplicate feedback network by opening switches B and C, and the 310 block shows the selecting of a real feedback network by closing switches A and D.

Figure 4:
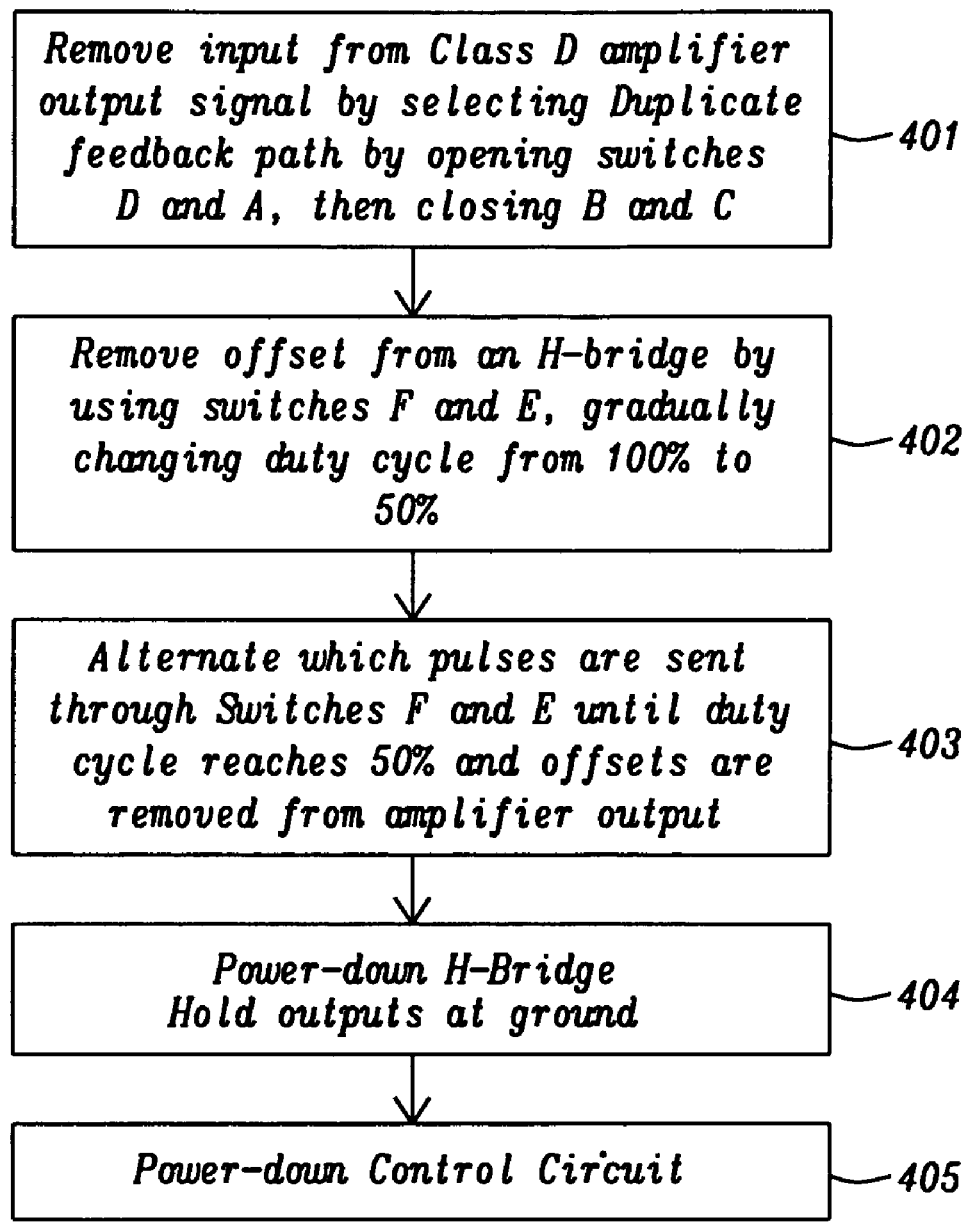
FIG. 4 shows a method flowchart for the elimination of clicking and popping noise for Class D amplifiers during Power-down or during entry of Standby.

FIG. 4 shows the flowchart of a method for eliminating popping and clicking noise in Class D amplifiers during power-down or during entry of standby. The method assumes a duplicate feedback network which is used to remove operating voltages and offsets in a signal path during power-down and when exiting standby using a set of switches A, B, C, D, E and F which enable said duplicate feedback network. The first block 401 in the flowchart shows the removal of signal from the Class D amplifier by selecting the duplicate feedback network path by opening switches D and A, then closing switches B and C. The next block 402 is the removing of the offset from the H-bridge by using switches F and E, gradually changing the duty cycle from 100% to 50%. In addition, block 402 also shows the alternating of pulses which are sent through switches F and E until the duty cycle reaches 50% and the offsets are removed the Class D amplifier output. The 403 block shows the powering down of the H-bridge. Finally, the 404 block shows the powering down of the control circuit.

The key advantages of this device and method are as follows.

1) The invention allows the elimination of pop and click noise from the output of Class D amplifiers during the transitions of power-on, power-off, entering standby and exiting standby.

2) The method prevents pop and click noise for all operating conditions, since the control circuit 21 controls the opening and closing of switches A, B, C, D, E and F as a function of operating conditions such as temperature, humidity, input waveform, internal noise, and external noise. Since the technique adapts to the operating points of the circuit, it is immune to operating conditions.

While this invention has been particularly shown and described with Reference to the preferred embodiments thereof, it will be understood by those Skilled in the art that various changes in form and details may be made without Departing from the spirit and scope of this invention.

What is claimed is:

1. A duplicate feedback resistor network in Class D amplifiers comprising:
an input section with input switches which takes audio input and drives a first input to a control circuit,
said control circuit output which drives output pre-drivers,
said output pre-drivers which drive an H-bridge switch,
said H-bridge switch which drives differential audio outputs and a regular feedback network,
said regular feedback network in communication with said differential audio outputs is connected through said input section, through said input switches, and drives said first input of said control circuit,
said duplicate feedback resistor network in communication with said control circuit output is connected through said input section, through said input switches, and drives a second input of said control circuit,
wherein said duplicate feedback resistor network is used to complete a control loop of said Class D amplifier in order to suppress pops and clicks noise when starting up and exiting a standby mode and shutting down or entering said standby mode in said Class D amplifier.

2. The duplicate feedback resistor network in Class D amplifiers of claim 1, wherein said control circuit output drives said switches E and F which swap the differential outputs of said control circuit.

3. The duplicate feedback resistor network in Class D amplifiers of claim 2, wherein said switches E and F allow the gradual propagation or dissipation of offset voltages through a signal path of said Class D amplifier, in order to suppress pop and click noise.

4. The duplicate feedback resistor network in Class D amplifiers of claim 2, wherein said input section contains switches B and D which select control circuit input from said duplicate feedback resistor network or said audio input and said regular feedback network respectively.

5. The duplicate feedback resistor network in Class D amplifiers of claim 2, wherein a switch A enables said regular feedback network to feed said regular feedback network input to said control circuit.

6. The duplicate feedback resistor network in Class D amplifiers of claim 3, wherein alternating which pulses are sent through switches E versus through switch F, output rise time from said Class D amplifier output can be controlled, thereby avoiding any audible signals on said output.

7. The duplicate feedback resistor network in Class D amplifiers of claim 6, wherein during power-on or during the exiting of standby, a duty cycle of selecting switch F versus switch E is gradually increased from 50% to 100% at a slow inaudible rate.

8. The duplicate feedback resistor network in Class D amplifiers of claim 6, wherein at the end of power-on or at the end of exiting standby, said duplicate feedback resistor network is deselected by opening said switches C and said regular feedback network is enabled via said switch A.

9. The duplicate feedback resistor network in Class D amplifiers of claim 6, wherein during power-down or during the entering of standby, a duty cycle of selecting switch F versus switch E is gradually decreased from 100% to 50% at a slow inaudible rate.

10. The duplicate feedback resistor network in Class D amplifiers of claim 6, wherein at the end of power-dawn or the end of entering standby, said duplicate feedback resistor network is selected by opening said switches D and A, and closing said switches C and B, and after voltage offset is dissipated from said Class D amplifier output said H-bridge and said control circuit are powered down.

11. A method of providing a duplicate feedback resistor network in Class D amplifiers comprising the steps of:
 providing an input section with input switches which takes audio input and drives a first input to a control circuit,
 providing said control circuit output which drives output pre-drivers,
 providing said output pre-drivers which drive an H-bridge switch,
 providing said H-bridge switch which drives differential audio outputs and a regular feedback network,
 providing said regular feedback network in communication with said differential audio outputs is connected through said input section, through said input switches and drives said first input of said control circuit,
 providing said duplicate feedback resistor network in communication with said control circuit output is connected through said input section, through said input switches and drives a second input of said control circuit,
wherein said duplicate feedback resistor network is used to complete a control loop of said Class D amplifier in order to suppress pops and clicks noise when starting up and exiting standby and shutting down or entering standby in said Class D amplifier.

12. The method of providing a duplicate feedback resistor network in Class D amplifiers of claim 11, wherein said control circuit output contains switches E and F which swap the differential outputs of said control circuit.

13. The method of providing a duplicate feedback resistor network in Class D amplifiers of claim 12, wherein said switches E and F allow the gradual propagation or dissipation of offset voltages through a signal path of said Class D amplifier, in order to suppress pop and click noise.

14. The method of providing a duplicate feedback resistor network in Class D amplifiers of claim 12, wherein said input section contains switches B and D which select control circuit input from said duplicate feedback resistor network or said audio input and said regular feedback network respectively.

15. The method of providing a duplicate feedback resistor network in Class D amplifiers of claim 12, wherein a switch A enables said regular feedback network to feed said regular feedback network input to said control circuit.

16. The method of providing a duplicate feedback resistor network in Class D amplifiers of claim 13, wherein alternating which pulses are sent through switches E versus through switch F, output rise time from said Class D amplifier output can be controlled, thereby avoiding any audible signals on said output.

17. The method of providing a duplicate feedback resistor network in Class D amplifiers of claim 16, wherein during power-on or during the exiting of standby, a duty cycle of selecting switch F versus switch E is gradually increased from 50% to 100% at a slow inaudible rate.

18. The method of providing a duplicate feedback resistor network in Class D amplifiers of claim 16, wherein at the end of power-on or at the end of exiting standby, said duplicate feedback resistor network is deselected by opening said switches C and said regular feedback network is enabled via said switch A.

19. The method of providing a duplicate feedback resistor network in Class D amplifiers of claim 16, wherein during power-down or during the entering of standby, a duty cycle of selecting switch F versus switch E is gradually decreased from 100% to 50% at a slow inaudible rate.

20. The method of providing a duplicate feedback resistor network in Class D amplifiers of claim 16, wherein at the end of power-down or the end of entering standby, said duplicate feedback resistor network is selected by opening said switches D and A, and closing said switches C and B, and after voltage offset is dissipated from said Class D amplifier output said H-bridge and said control circuit are powered down.

21. A method for eliminating popping and clicking noise in Class D amplifiers during power-up or during exiting standby comprising the steps of:
 providing a duplicate feedback network which is used to establish operating voltages and offsets in a signal path during power-up and during exiting standby,
 providing switches A, B, C, D, E and F which enable said duplicate feedback network and which allow for a duty cycle for the opening and closing of said switches A, B, C, D, E and F,
 grounding an H-bridge output circuit during said powering up of said control circuit,
 powering up a control circuit which will then be in a reset state,
 releasing said control circuit from said reset state after bias currents are established,
 closing said switches B and C and opening said switches A and D during power-up or while exiting standby,
 enabling said H-bridge output,
 transferring control circuit output to said H-bridge output using said switches E and F with a 50% duty cycle,
 alternating which pulses are sent through said switches E and F wherein amplifier output rise time can be controlled thereby avoiding audible signals on said output gradually changing said duty cycle,
 deselecting said duplicate feedback network by opening said switches C and B, and
 selecting a real feedback network by closing said switches A and D.

22. The method for eliminating popping and clicking noise in Class D amplifiers during power-up or during exiting standby of claim 21, wherein duty cycle of selecting said F switches over said E switches is gradually increased from 50% to 100%.

23. The method for eliminating popping and clicking noise in Class D amplifiers during power-up or during exiting standby of claim 22, wherein rate of increase in said duty cycle on said F switches over said E switches is slow enough to be inaudible.

24. A method for eliminating popping and clicking noise in Class ID amplifiers during power-down or during entering standby comprising the steps of:

provising a duplicate feedback network which is used to establish operating voltages and offsets in a signal path during power-up and during exiting standby, providing switches A, B, C, D, E and F which enable said duplicate network and which allow for a duty cycle for the opening and closing of said switches A, B, C, D, E and F, removing input from amplifier output signal by selecting said duplicate feedback network by opening said switches D and A and closing said switches C and B, removing offset from an H-bridge by using said switches F and E and gradually changing duty cycle of using said switch F over said switch E from 100% to 50%, alternating which pulses are sent through said switches F and E until duty cycle reaches 50% and said offsets are removed from the output of said H-bridge, powering down H-bridge, holding down H-bridge output which is audio output to ground, and powering down control circuit.

25. The method for eliminating popping and clicking noise in Class D amplifiers during power-down or during entering standby of claim 24, wherein duty cycle of selecting said F switches over said E switches is gradually reduced from 100% to 50%.

26. The method for eliminating popping and clicking noise in Class D amplifiers during power-down or during entering standby of claim 25, wherein rate of decrease in said duty cycle on said F switches over said E switches is slow enough to be inaudible.

* * * * *